(12) United States Patent
Kim et al.

(10) Patent No.: US 8,742,452 B2
(45) Date of Patent: Jun. 3, 2014

(54) SEMICONDUCTOR DEVICE AND METHOD FOR MANUFACTURING SEMICONDUCTOR DEVICE

(71) Applicant: Samsung Electro-Mechanics Co., Ltd., Suwon (KR)

(72) Inventors: Kwang Soo Kim, Suwon (KR); Bum Seok Suh, Suwon (KR); In Hyuk Song, Suwon (KR); Jae Hoon Park, Suwon (KR); Dong Soo Seo, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/761,127

(22) Filed: Feb. 6, 2013

(65) Prior Publication Data

US 2014/0015003 A1    Jan. 16, 2014

(30) Foreign Application Priority Data

Jul. 16, 2012    (KR) .................. 10-2012-0077332

(51) Int. Cl.
*H01L 29/78*    (2006.01)
*H01L 29/739*   (2006.01)
*H01L 29/66*    (2006.01)

(52) U.S. Cl.
CPC ........ *H01L 29/7397* (2013.01); *H01L 29/7813* (2013.01); *H01L 29/66727* (2013.01)
USPC .................. 257/139; 257/331; 257/E29.197; 257/E29.262; 257/E21.384; 438/137; 438/138; 438/270

(58) Field of Classification Search
CPC ............ H01L 29/7397; H01L 29/7802; H01L 29/7813; H01L 29/66348; H01L 29/66727; H01L 29/66734
USPC .......................... 257/133, 139, 327–332, 617; 438/137–138, 270
See application file for complete search history.

(56) References Cited

U.S. PATENT DOCUMENTS

| | | | |
|---|---|---|---|
| 6,768,168 B1 * | 7/2004 | Takahashi ..................... | 257/330 |
| 8,174,066 B2 * | 5/2012 | Izumi ............................ | 257/332 |
| 8,390,060 B2 * | 3/2013 | Darwish et al. ............... | 257/330 |
| 2008/0277688 A1 * | 11/2008 | Tamada ......................... | 257/139 |
| 2011/0140165 A1 * | 6/2011 | Kusunoki et al. ............. | 257/139 |
| 2012/0313139 A1 * | 12/2012 | Matsuura et al. ............. | 257/139 |
| 2013/0193510 A1 * | 8/2013 | Foerster et al. ................ | 257/331 |
| 2013/0248925 A1 * | 9/2013 | Gejo .............................. | 257/139 |
| 2013/0292738 A1 * | 11/2013 | Nakamura .................... | 257/133 |

* cited by examiner

*Primary Examiner* — Michael Lebentritt
(74) *Attorney, Agent, or Firm* — Ladas & Parry, LLP

(57) ABSTRACT

Disclosed herein are a semiconductor device, and a method for manufacturing the semiconductor device. The semiconductor device includes a semiconductor substrate, a base region formed on an upper region of an inside of the semiconductor substrate, at least one gate electrode that penetrates through the base region and has an inverted triangular shape, a gate insulating film formed to enclose an upper portion of the semiconductor substrate and the gate electrode, an inter-layer insulating film formed on an upper portion of the gate electrode and the gate insulating film, an emitter region formed inside the base region and on both sides of the gate electrode, an emitter metal layer formed on an upper portion of the base region and inter-layer insulating film, and a buffer region formed to enclose a lower portion of the gate electrode and to be spaced apart from the base region.

19 Claims, 5 Drawing Sheets

SEMICONDUCTOR DEVICE AND METHOD FOR MANUFACTURING SEMICONDUCTOR DEVICE

CROSS REFERENCE TO RELATED APPLICATION

This application claims the benefit of Korean Patent Application No. 10-2012-0077332, filed on Jul. 16, 2012, entitled "Semiconductor Device and Method for Manufacturing Semiconductor Device", which is hereby incorporated by reference in its entirety into this application.

BACKGROUND OF THE INVENTION

1. Technical Field

The present invention relates to a semiconductor device and a method for manufacturing the semiconductor device.

2. Description of the Related Art

The demand for inverters used in robots, air conditioners, machine tools, and the like, industrial electronics which are represented by an uninterrupted power supply for office machine, and small-sized power converters, is rapidly increasing. It has been gradually important in these power converters that the apparatus has a smaller size and a lighter weight, a higher efficiency, and a lower noise. However, these requests are difficult to simultaneously satisfy by only power semiconductor devices of the prior art, such as, a bipolar transistor, a high power MOS field effect transistor (MOSFET), or the like. Therefore, an insulated gate bipolar transistor (IGBT), which is a semiconductor device retaining both of high-speed switching characteristics of the high power MOSFET and high power characteristics of the bipolar transistor, has received attention. A trench structured IGBT has a structure where a plurality of trench grooves are formed to promote a high withstand voltage and a gate insulating film and a gate electrode are disposed within the trench (U.S. Pat. No. 5,801,408).

SUMMARY OF THE INVENTION

The present invention has been made in an effort to provide a semiconductor device that may reduce time and cost and a method for manufacturing the semiconductor device.

The present invention has been also made in an effort to provide a semiconductor device that may reduce a saturation voltage and a method for manufacturing the semiconductor device.

According to a preferred embodiment of the present invention, there is provided a semiconductor device including: a semiconductor substrate; a base region that is formed in an upper region of an inside of the semiconductor substrate; at least one gate electrode that penetrates through the base region and is formed into an inverted triangular shape; a gate insulating film that is formed so as to enclose an upper portion of the semiconductor substrate and the gate electrode; an inter-layer insulating film that is formed on an upper portion of the gate electrode and the gate insulating film; an emitter region that is formed inside the base region and on both sides of the gate electrode; an emitter metal layer that is formed on an upper portion of the base region and on an upper portion of the inter-layer insulating film; and a buffer region that is formed so as to enclose a lower portion of the gate electrode and formed so as to be spaced apart from the base region.

The semiconductor substrate may be an N-type semiconductor substrate.

The base region may include P-type low concentration impurities.

The emitter region may include N-type high concentration impurities.

The buffer region may include P-type high concentration impurities.

The gate insulating film may include at least one of a silicon oxide layer, silicon oxynitride (SiON), germanium oxynitride (GexOyNz), and a high dielectric constant material.

The gate electrode may be formed of polysilicon.

The inter-layer insulating film may include at least one of borophosphosilicate glass (BPSG) and tetraethylorthosilicate (TEOS).

The semiconductor substrate may be a <100> type silicon wafer.

According to another preferred embodiment of the present invention, there is provided a method for manufacturing a semiconductor device, including: preparing a semiconductor substrate; forming an inverted triangular-shaped gate trench on the semiconductor substrate; forming a buffer region that encloses a lower portion of the gate trench; forming a gate insulating film on an upper portion of the semiconductor substrate and an inner wall of the gate trench; forming a gate electrode inside the gate trench; forming an inter-layer insulating film on an upper portion of the gate electrode; forming a base region on an upper portion of an inside of the semiconductor substrate so as to be spaced apart from the buffer region; forming an emitter region inside the base region and on both sides of the gate electrode; and forming an emitter metal layer on an upper portion of the base region and on an upper portion of the inter-layer insulating film.

The semiconductor substrate may be an N-type semiconductor substrate.

The semiconductor substrate may be a <100> type silicon wafer.

The forming of the gate trench may include forming a patterned etching resist on the upper portion of the semiconductor substrate, forming the inverted triangular-shaped gate trench by performing wet etching on the semiconductor substrate, and removing the etching resist.

In the forming of the buffer region, the buffer region may be formed by injecting P-type high concentration impurities into the semiconductor substrate through the gate trench.

In the forming of the gate insulating film, the gate insulating film may include at least one of a silicon oxide layer, silicon oxynitride (SiON), germanium oxynitride (GexOyNz), and a high dielectric constant material.

The forming of the gate electrode may include forming a polysilicon that is formed inside the gate trench, on an upper portion of the gate trench, and on an upper portion of the gate insulating film, and removing the polysilicon formed on the upper portion of the gate trench and the upper portion of the gate insulating film by an etch back or wet etching process.

In the forming of the inter-layer insulating film, the inter-layer insulating film may include at least one of borophosphosilicate glass (BPSG) and tetraethylorthosilicate (TEOS).

In the forming of the base region, the base region may be formed by injecting P-type low concentration impurities into the semiconductor substrate.

In the forming of the emitter region, the emitter region may be formed by injecting N-type high concentration impurities into the base region.

BRIEF DESCRIPTION OF THE DRAWINGS

The above and other objects, features, and advantages of the present invention will be more clearly understood from the following detailed description taken in conjunction with the accompanying drawings, in which:

FIG. 1 is an exemplified diagram showing a semiconductor device according to an embodiment of the present invention.

DESCRIPTION OF THE PREFERRED EMBODIMENTS

Figure 1:
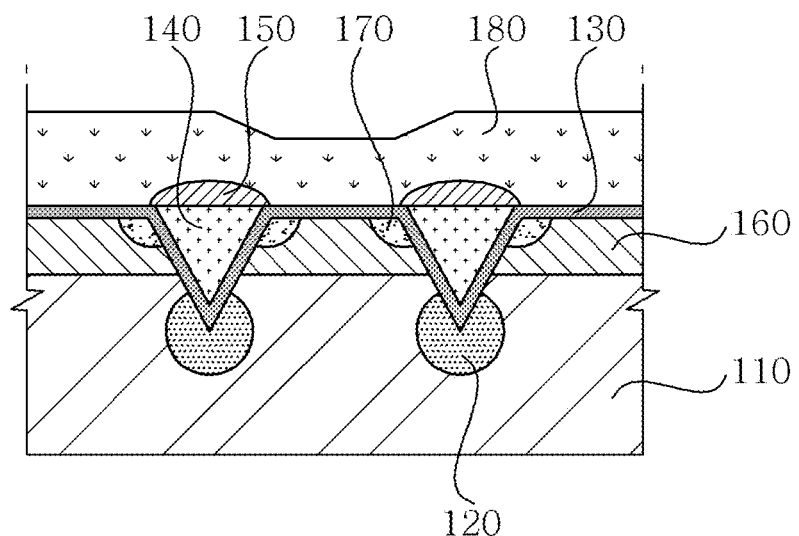

The objects, features, and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side", and the like are used to differentiate a certain component from other components, but the configuration of such components should not be construed to be limited by the terms. Hereinafter, preferred embodiments of the present invention will be described in detail with reference to the attached drawings.

FIG. 1 is an exemplified diagram showing a semiconductor device according to an embodiment of the present invention.

Referring to FIG. 1, a semiconductor device 100 may include a semiconductor substrate 110, a base region 160, a gate electrode 140, a gate insulating film 130, an inter-layer insulating film 150, an emitter region 170, an emitter metal layer 180, and a buffer region 120.

The semiconductor substrate 110 may be a <100> type silicon wafer. In the <100> type silicon wafer, silicon crystals are arranged in an X-Y direction. In addition, the semiconductor substrate 110 may be an N-type semiconductor substrate. That is, the semiconductor substrate 110 may be a semiconductor substrate on which the N-type impurities are doped. Here, the N-type impurities may be group V five group elements such as phosphorus (P), arsenic (As), or the like.

The base region 160 may be formed inside the semiconductor substrate 110. In addition, the base region 160 may be positioned on an upper region of the semiconductor substrate 110. The base region 160 may be formed by injecting P-type low concentration impurities into the semiconductor substrate 110. For example, the P-type impurities may be boron (B), boron fluoride ($BF_2$ and $BF_3$), indium (In), or the like.

The gate electrode 140 may be formed so as to penetrate through the base region 160. In addition, the gate electrode 140 may be formed on the semiconductor substrate 110 in the form of an inverted triangular trench. One or more the gate electrode 140 may be formed. The gate electrode 140 may be made of polysilicon. In FIG. 1, two gate trench electrodes 140 are formed, but the present invention is not limited thereto. The number of gate trench electrodes 140 may be designed and changed by those skilled in the art.

The gate insulating film 130 may be formed so as to enclose an upper portion of the semiconductor substrate 110 and the gate electrode 140. The gate insulating film 130 may be formed to electrically insulate the gate electrode 140 and the semiconductor substrate 110. The gate insulating film 130 may be a laminated film in which a silicon oxide layer, silicon oxynitride (SiON), germanium oxynitride (GexOyNz), and a high dielectric constant material are sequentially laminated, or a combination thereof. The high dielectric constant material may be hafnium oxide ($HfO_2$), zirconia carbon ($ZrO_2$), Bauxite ($Al_2O_3$), tantalum oxide ($Ta_2O_5$), hathium-silicate, zirconium-silicate, or a combination thereof.

The inter-layer insulating film 150 may be formed on an upper portion of the gate electrode 140 and gate insulating film 130. The inter-layer insulating films 150 that are respectively formed on the upper portion of the gate electrode 140 may be formed so as to be spaced apart from each other. The inter-layer insulating film 150 may be made of borophosphosilicate glass (BPSG). Otherwise, the inter-layer insulating film 150 may be made of tetraethylorthosilicate (TEOS) which is an organic-based material.

The emitter region 170 may be formed inside the base region 160. In addition, the emitter region 170 may be formed on both sides of the gate electrode 140. The emitter region 170 may be formed by injecting N-type high concentration impurities into the base region 160. In this instance, the emitter region 170 may be formed so as to be adjacent to an upper surface of the semiconductor substrate 110 which is an upper region of an inside of the base region 160. In this instance, a lower surface of the emitter region 170 may be formed so as to be spaced apart from a lower boundary surface of the base region 160.

The emitter metal layer 180 may be formed on an upper portion of the base region 160 and on an upper portion of the inter-layer insulating film 150. The emitter metal layer 180 may be made of a conductive metal such as tungsten, or the like.

The buffer region 120 may be formed so as to enclose a lower portion of the gate electrode 140. In addition, the buffer region 120 may be formed so as to be spaced apart from the lower boundary surface of the base region 160. In this manner, the buffer region 120 that is formed to enclose the lower portion of the gate electrode 140 may be formed so as to prevent an electric field from being centralized on a lower sharp edge of the gate electrode 140. The buffer region 120 may be formed by injecting P-type high concentration impurities.

FIGS. 2 to 10 are exemplified diagrams showing a method for manufacturing a semiconductor device according to another embodiment of the present invention.

Figure 2:
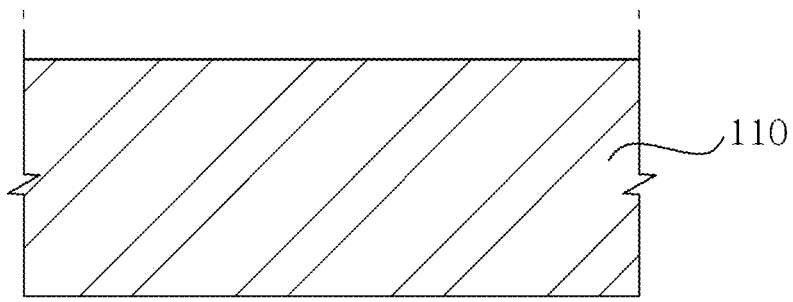
FIGS. 2 to 10 are exemplified diagrams showing a method for manufacturing a semiconductor device according to another embodiment of the present invention.

Referring to FIG. 2, a semiconductor substrate 110 is prepared. The semiconductor substrate 110 may be a <100> type silicon wafer. In the <100> type silicon wafer, silicon crystals are arranged in an X-Y direction. In addition, the semiconductor substrate 110 may be an N-type semiconductor substrate. That is, the semiconductor substrate 110 may be a semiconductor substrate on which the N-type impurities are doped. Here, the N-type impurities may be group V elements such as phosphorus (P), arsenic (As), or the like.

Figure 3:
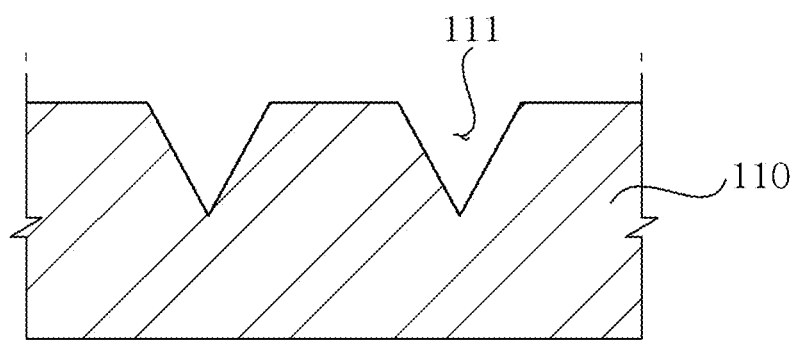

Referring to FIG. 3, a gate trench 111 may be formed on the semiconductor substrate 110. The gate trench 111 may be formed inside the semiconductor substrate 110 so that a cross-section of the gate trench 111 has an inverted triangular shape. First, a patterned etching resist (not shown) may be formed on the upper portion of the semiconductor substrate 110. The etching resist (not shown) may be patterned so that a region in which the gate trench 111 is formed is open. The etching resist (not shown) is positioned on the upper portion of the semiconductor substrate 110, and then wet etching may be performed. The wet etching has a faster etching speed than that of an etching method (plasma RIE) using plasma. An etchant for the wet etching may be one solution of sulfuric acid ($H_2SO_4$), nitric acid ($HNO_3$), phosphoric acid ($H_3PO_4$), hydrofluoric acid (HF), ammonium fluoride ($NH_4F$), hydrochloric acid (HCl), hydrogen peroxide ($H_2O_2$), sodium hydroxide (NaOH), and potassium hydroxide(KOH). According to an embodiment of the present invention, since the semiconductor substrate 110 is the <100> type silicon wafer, when performing wet etching, the inverted triangular gate trench 111 may be formed as shown in FIG. 3. In addition, by performing the wet etching, a gate trench 111 that has a smooth inner wall due to a crystal growth direction of the semiconductor substrate 110. After the inverted triangular gate trench 111 is formed on the semiconductor substrate 110 in this manner, the etching resist (not shown) may be removed. In an embodiment of the present invention, two gate trenches 111 are shown, but the present invention is not limited thereto. That is, the number of gate trenches 111 is not limited, and may be changed depending on needs of those skilled in the art.

Figure 4:
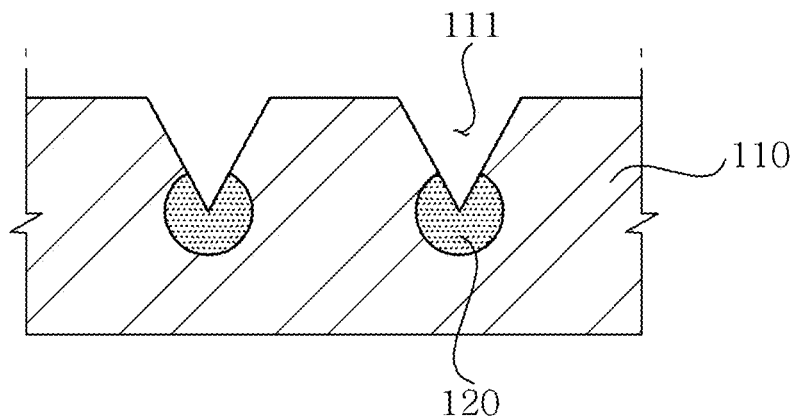

Referring to FIG. 4, the buffer region 120 that encloses a lower portion of the gate trench 111 may be formed. The buffer region 120 may be formed by injecting P-type high concentration impurities into the semiconductor substrate 110 through the gate trench 111. Therefore, the buffer region 120 may be formed so as to enclose the lower sharp edge of the gate trench 111.

Figure 5:
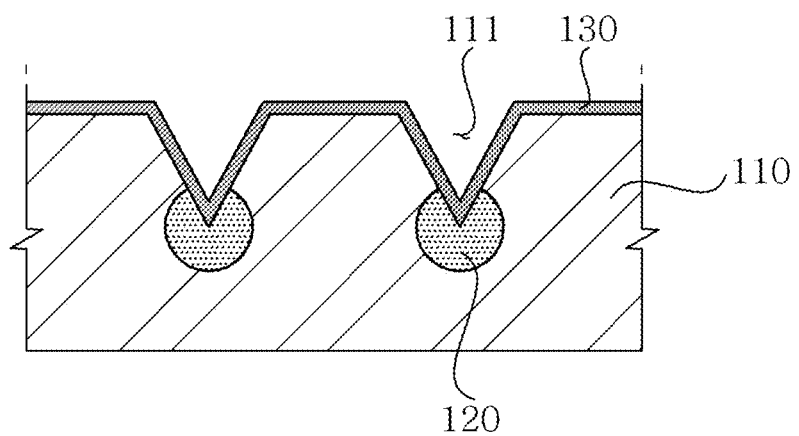

Referring to FIG. 5, the gate insulating film 130 may be formed. The gate insulating film 130 may be formed on the upper portion of the semiconductor substrate 110 and on the inner wall of the gate trench 111. For example, the gate insulating film 130 may be a laminated layer in which a silicon oxide layer, silicon oxynitride (SiON), germanium oxynitride (GexOyNz), and a high dielectric constant material are sequentially laminated, or a combination thereof. The high dielectric constant material may be hafnium oxide (HfO2), zirconia carbon ($ZrO_2$), Bauxite ($Al_2O_3$), tantalum oxide ($Ta_2O_5$), hathium-silicate, zirconium-silicate, or a combination thereof.

Figure 6:
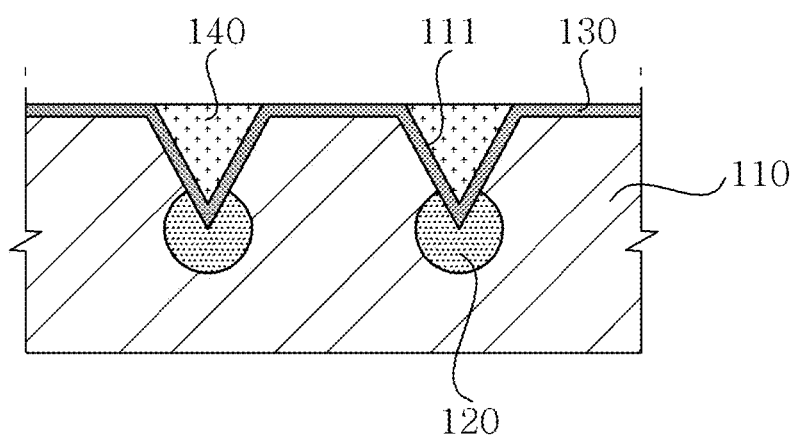

Referring to FIG. 6, the gate electrode 140 may be formed. First, polysilicon may be formed on an upper portion of the gate insulating film 130. When forming the poly silicon on the upper portion of the gate insulating film 130, the inside of the gate trench 111 may be filled with the polysilicon. In addition, the poly silicon may be formed on the upper portion of the gate insulating film 130 and gate trench 111 so as to have a predetermined thickness. Next, the poly silicon formed on the upper portion of the gate insulation layer 130 and the gate trench 111 may be removed. That is, the remaining poly silicon excluding the poly silicon that fills the inside of the gate trench 111 may be removed. The poly silicon that fills the inside of the gate trench 111 may be a gate trench electrode 140. The removal of the poly silicon may be performed by etch back or wet etching. When at least one gate trench 111 is formed, at least one gate trench electrode 140 may be formed likewise.

Figure 7:
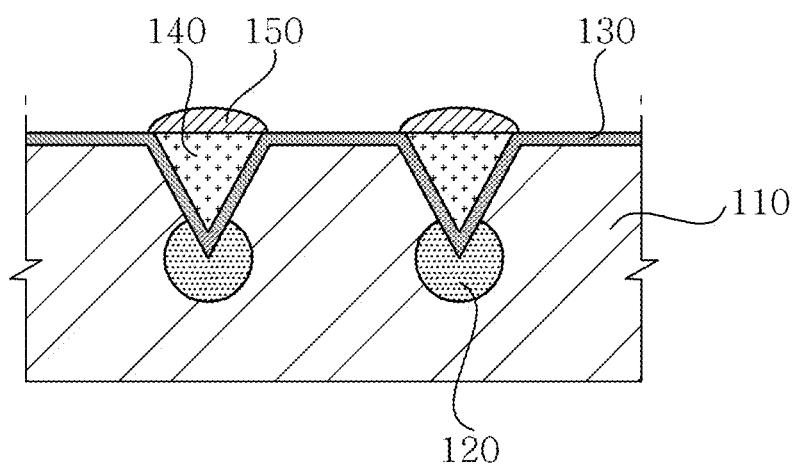

Referring to FIG. 7, the inter-layer insulating film 150 may be formed on an upper portion of the gate insulating film 130 and on an upper portion of the gate electrode 140. When at least one gate trench electrode 140 is formed, at least one inter-layer insulation layer 150 may be formed likewise. The inter-layer insulating films 150 that are respectively formed on the upper portion of the gate trench electrode 140 may be formed so as to be spaced apart from each other. For example, the inter-layer insulation layer 150 may be made of borophosphosilicate glass (BPSG). Otherwise, the inter-layer insulation layer 150 may be made of tetraethylorthosilicate (TEOS) which is an organic-based material.

Figure 8:
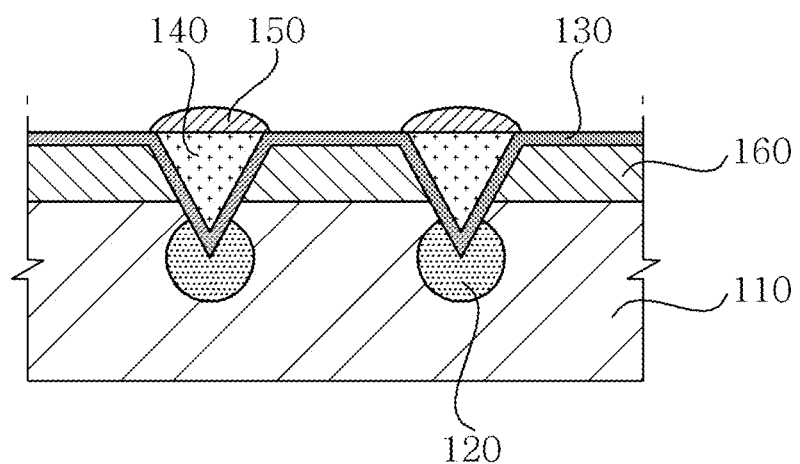

Referring to FIG. 8, the base region 160 may be formed. The base region 160 may be formed by injecting P-type impurities into the semiconductor substrate 110. In this instance, the base region 160 may be formed so that a lower boundary surface of the base region 160 is spaced apart from the buffer region 120 that is formed on a lower portion of the gate insulation layer 130. For example, the P-type impurities may be boron (B), boron fluoride ($BF_2$ and $BF_3$), indium (In), or the like.

Figure 9:
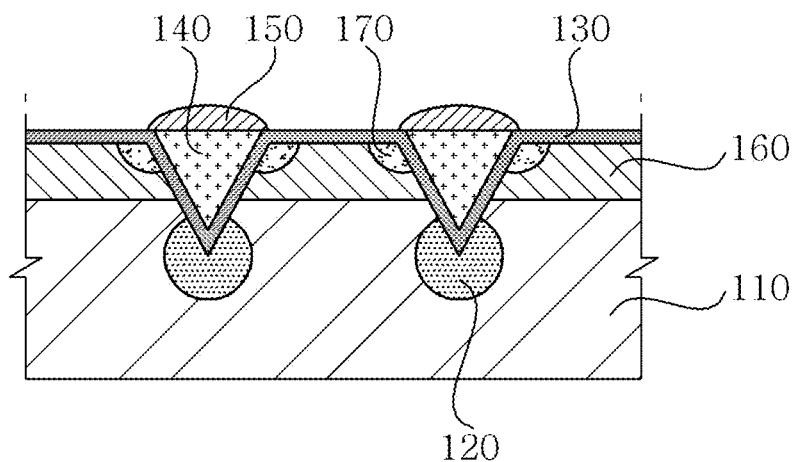

Referring to FIG. 9, the emitter region 170 may be formed. The emitter region 170 may be formed by injecting N-type high concentration impurities into the base region 160. In this instance, the emitter region 170 may be formed so as to be adjacent to an upper surface of the semiconductor substrate 110 that is an upper region of the inside of the base region 160. In addition, the emitter region 170 may be formed on both sides of the gate electrode 140. The emitter region 170 is formed inside the base region 160 and formed so as to be spaced apart from the lower boundary surface of the base region 160.

Figure 10:
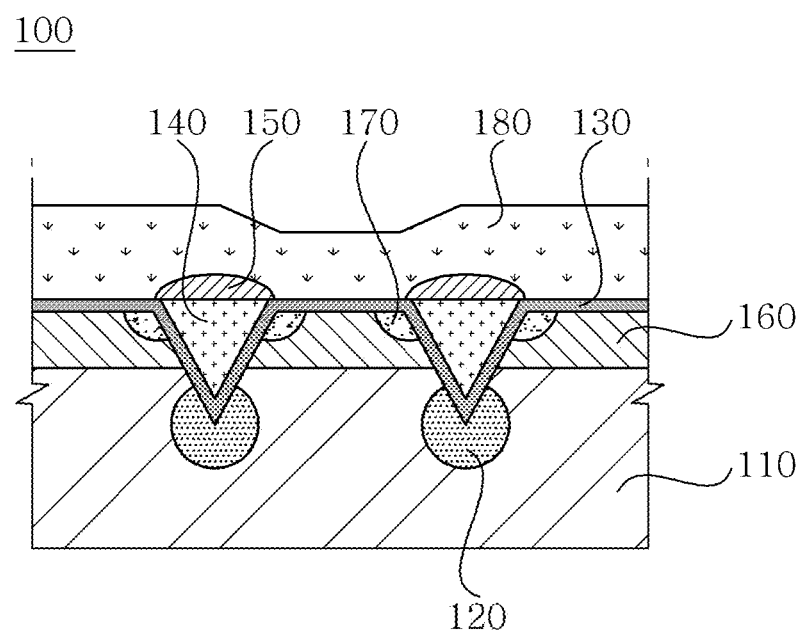

Referring to FIG. 10, the emitter metal layer 180 may be formed. The emitter metal layer 180 may be formed on an upper portion of the base region 160 and on an upper portion of the inter-layer insulating film 150. The emitter metal layer 180 may be made of conductive metal such as tungsten, or the like.

In this manner, through the method for manufacturing the semiconductor device in FIGS. 2 to 10, the semiconductor device 100 in which the gate electrode according to an embodiment of the present invention has the inverted triangular shape may be formed.

As described above, in the semiconductor device and the method for manufacturing the semiconductor device according to the embodiments of the present invention, the gate trench for forming the gate electrode may be formed by a wet process, thereby reducing manufacturing time and cost. In addition, the wet process may be performed using the silicon wafer as the semiconductor substrate, thereby forming the gate trench with a smooth inner wall. Accordingly, it is possible to reduce a surface area of the gate trench, and to minimize charge trap generated along a surface of the gate trench to thereby reduce a saturation voltage.

In the present invention, the IGBT device has been described, but the semiconductor device to which the embodiment of the present invention is applied is not limited to the IGBT. That is, the embodiments of the present invention may be applied to the semiconductor device such as an N-channel MOSFET or a P-channel MOSFET.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations, or equivalent arrangements should be considered to be within the scope of the invention, and the detailed scope of the invention will be disclosed by the accompanying claims.

What is claimed is:

1. A semiconductor device comprising:
   a semiconductor substrate;
   a base region that is formed on an upper region of an inside of the semiconductor substrate;
   at least one gate electrode that penetrates through the base region and is formed into an inverted triangular shape;
   a gate insulating film that is formed so as to enclose an upper portion of the semiconductor substrate and the gate electrode;
   an inter-layer insulating film that is formed on an upper portion of the gate electrode and the gate insulating film;
   an emitter region that is formed inside the base region and on both sides of the gate electrode;

an emitter metal layer that is formed on an upper portion of the base region and on an upper portion of the inter-layer insulating film; and a buffer region that is formed so as to enclose a lower portion of the gate electrode and formed so as to be spaced apart from the base region.

2. The semiconductor device as set forth in claim 1, wherein the semiconductor substrate is an N-type semiconductor substrate.

3. The semiconductor device as set forth in claim 1, wherein the base region includes P-type low concentration impurities.

4. The semiconductor device as set forth in claim 1, wherein the emitter region includes N-type high concentration impurities.

5. The semiconductor device as set forth in claim 1, wherein the buffer region includes P-type high concentration impurities.

6. The semiconductor device as set forth in claim 1, wherein the gate insulating film includes at least one of a silicon oxide layer, silicon oxynitride (SiON), germanium oxynitride (GexOyNz), and a high dielectric constant material.

7. The semiconductor device as set forth in claim 1, wherein the gate electrode is formed of polysilicon.

8. The semiconductor device as set forth in claim 1, wherein the inter-layer insulating film includes at least one of borophosphosilicate glass (BPSG) and tetraethylorthosilicate (TEOS).

9. The semiconductor device as set forth in claim 1, wherein the semiconductor substrate is a <100> type silicon wafer.

10. A method for manufacturing a semiconductor device comprising:
preparing a semiconductor substrate;
forming an inverted triangular-shaped gate trench on the semiconductor substrate;
forming a buffer region that encloses a lower portion of the gate trench;
forming a gate insulating film on an upper portion of the semiconductor substrate and an inner wall of the gate trench;
forming a gate electrode inside the gate trench;
forming an inter-layer insulating film on an upper portion of the gate electrode;
forming a base region on an upper portion of an inside of the semiconductor substrate so as to be spaced apart from the buffer region;
forming an emitter region inside the base region and on both sides of the gate electrode; and
forming an emitter metal layer on an upper portion of the base region and on an upper portion of the inter-layer insulating film.

11. The method for manufacturing the semiconductor device as set forth in claim 10, wherein the semiconductor substrate is an N-type semiconductor substrate.

12. The method for manufacturing the semiconductor device as set forth in claim 10, wherein the semiconductor substrate is a <100> type silicon wafer.

13. The method for manufacturing the semiconductor device as set forth in claim 10, wherein the forming of the gate trench includes:
forming a patterned etching resist on the upper portion of the semiconductor substrate,
forming the inverted triangular-shaped gate trench by performing wet etching on the semiconductor substrate, and
removing the etching resist.

14. The method for manufacturing the semiconductor device as set forth in claim 10, wherein, in the forming of the buffer region, the buffer region is formed by injecting P-type high concentration impurities into the semiconductor substrate through the gate trench.

15. The method for manufacturing the semiconductor device as set forth in claim 10, wherein, in the forming of the gate insulating film, the gate insulating film includes at least one of a silicon oxide layer, silicon oxynitride (SiON), GexOyNz, and a high dielectric constant material.

16. The method for manufacturing the semiconductor device as set forth in claim 10, wherein the forming of the gate electrode includes:
forming a polysilicon that is formed inside the gate trench, on an upper portion of the gate trench, and on an upper portion of the gate insulating film, and
removing the polysilicon formed on the upper portion of the gate trench and the upper portion of the gate insulating film by an etch back or wet etching process.

17. The method for manufacturing the semiconductor device as set forth in claim 10, wherein, in the forming of the inter-layer insulating film, the inter-layer insulating film includes at least one of borophosphosilicate glass (BPSG) and tetraethylorthosilicate (TEOS).

18. The method for manufacturing the semiconductor device as set forth in claim 10, wherein, in the forming of the base region, the base region is formed by injecting P-type low concentration impurities into the semiconductor substrate.

19. The method for manufacturing the semiconductor device as set forth in claim 10, wherein, in the forming of the emitter region, the emitter region is formed by injecting N-type high concentration impurities into the base region.

* * * * *